US009450084B2

(12) United States Patent
Ueno

(10) Patent No.: US 9,450,084 B2
(45) Date of Patent: Sep. 20, 2016

(54) WIDE BAND GAP SEMICONDUCTOR DEVICE

(75) Inventor: Katsunori Ueno, Matsumoto (JP)

(73) Assignee: FUJI ELECTRIC SYSTEMS CO. LTD., Kawasaki-shi (JP)

( * ) Notice: Subject to any disclaimer, the term of this patent is extended or adjusted under 35 U.S.C. 154(b) by 729 days.

(21) Appl. No.: 12/718,514

(22) Filed: Mar. 5, 2010

(65) Prior Publication Data

US 2010/0270586 A1 Oct. 28, 2010

(30) Foreign Application Priority Data

Apr. 28, 2009 (JP) .................................. 2009-108794

(51) Int. Cl.
| H01L 29/78 | (2006.01) |
| H01L 29/16 | (2006.01) |
| H01L 29/20 | (2006.01) |
| H02M 7/00 | (2006.01) |

(52) U.S. Cl.
CPC ....... *H01L 29/7813* (2013.01); *H01L 29/7803* (2013.01); *H01L 29/7815* (2013.01); *H01L 29/1608* (2013.01); *H01L 29/2003* (2013.01); *H02M 7/003* (2013.01); *Y02B 70/1483* (2013.01)

(58) Field of Classification Search
CPC ........... H01L 29/7813; H01L 29/7803; H01L 29/7815
USPC ................. 257/355, 378, 76–78; 361/5, 93.9
See application file for complete search history.

(56) References Cited

U.S. PATENT DOCUMENTS

| 5,557,128 A * | 9/1996 | Yamazaki et al. ............ 257/341 |
| 7,098,488 B2 * | 8/2006 | Yoshikawa et al. .......... 257/176 |
| 7,825,480 B2 * | 11/2010 | Arai et al. .................... 257/401 |
| 2005/0045945 A1 | 3/2005 | Yoshikawa et al. |

(Continued)

FOREIGN PATENT DOCUMENTS

| CN | 101350618 A | 1/2009 |
| JP | 04-132266 A | 5/1992 |
| JP | 08-046193 A | 2/1996 |

(Continued)

OTHER PUBLICATIONS

Otsuki, M. et al.,"The 3rd Generation IGBT Toward a Limitation of IGBT Performance", Proceedings of 5th ISPSD, 1993, pp. 24-29. Cited in spec.

(Continued)

*Primary Examiner* — Laura Menz
*Assistant Examiner* — Candice Y Chan
(74) *Attorney, Agent, or Firm* — Rossi, Kimms & McDowell LLP

(57) ABSTRACT

A semiconductor device having high reliability and high load short circuit withstand capability while maintaining a low ON resistance is provided, by using a WBG semiconductor as a switching element of an inverter circuit. In the semiconductor device for application to a switching element of an inverter circuit, a band gap of a semiconductor material is wider than that of silicon, a circuit that limits a current when a main transistor is short circuited is provided, and the main transistor that mainly serves to pass a current, a sensing transistor that is connected in parallel to the main transistor and detects a microcurrent proportional to a current flowing in the main transistor, and a lateral MOSFET that controls a gate of the main transistor on the basis of an output of the sensing transistor are formed on the same semiconductor.

1 Claim, 6 Drawing Sheets

(56) References Cited

U.S. PATENT DOCUMENTS

2009/0008708 A1    1/2009    Arai et al.
2009/0085117 A1    4/2009    Harada et al.

FOREIGN PATENT DOCUMENTS

| JP | 11-354786 A | 12/1999 |
| JP | 2000-012853 A | 1/2000 |
| JP | 4132266 B2 | 3/2000 |
| JP | 2006-156479 A | 6/2006 |
| JP | 2006-319213 A | 11/2006 |
| JP | 2009-054765 A | 3/2009 |

OTHER PUBLICATIONS

Otsuki, M. et al., "Advanced thin wafer IGBTs with new thermal management solution", Proceedings of 5th ISPSD, 2003, pp. 144-147. Cited in spec.

Sugawara, Yoshitaka, "Recent Progress in SiC Power Device Developments and Application Status", Proceedings of 5th ISPSD, 2003.

First Notification of Reasons for Rejection for corresponding 201010150674.1, dated Oct. 25, 2013. Partial English translation provided.

Notification of Reasons for Refusal for corresponding JP 2009-108794, dated Sep. 3, 2013. Partial English translation provided.

* cited by examiner

WIDE BAND GAP SEMICONDUCTOR DEVICE

BACKGROUND

The present invention relates to a power semiconductor device in which a drift region is constituted by a semiconductor material having a band gap wider than that of silicon (Si) (referred to hereinbelow as WBG semiconductor).

It has been reported (see, for example, Japanese Patent Application Laid-Open No. 11-354786) that an ON resistance much lower than that of silicon can be realized by using a semiconductor with a band gap wider than that of silicon, such as silicon carbide (referred to hereinbelow as SiC) or gallium nitride (referred to hereinbelow as GaN), as a semiconductor material of a field effect transistor for power switching (referred to hereinbelow as power MOSFET).

The so-called IGBT is often used as a semiconductor device for power switching, and an inverter is one of applications thereof. FIG. 8 is a circuit diagram illustrating an inverter configuration. As shown in FIG. 8, in a typical three-phase inverter circuit, upper arms 50, 51, 52 and lower arms 53, 54, 55 are connected in series in each of phases U, V, and W and the serially connected structures of the upper and lower arms are connected in parallel. Each arm is constituted by an IGBT and a FWD (diode) that connects a cathode and an anode between the collector and emitter of the IGBT.

In the circuit configuration such as shown in FIG. 8, a load short circuit can occur due to a variety of factors such as erroneous operation caused by an abnormal gate pulse to the IGBT or noise and misconnection. Where the load short circuit occurs, the inverter control system detects an abnormality and an electric circuit flowing to the element is limited or the system is shut down. However, within a short period before the protection circuit is actuated at the time of load short circuit, the IGBT is exposed to a stress state of a high voltage and a large current.

Therefore, a breakdown withstand capability that is called a load short circuit withstand capability is required for the IGBT or FET that is used as a switching element of each arm. The load short circuit capability is an indicator that shows a period in which an element can withstand a stress state of a high voltage and a large current within a short period before the protection circuit is actuated at the time of load short circuit. A standard value for the load short circuit withstand capability is generally such that the element is not broken down within 10 μsec when a gate voltage is applied in the usual ON state under a power source voltage of ⅔ of an absolute rated voltage of the element, but a system has recently been designed such as to shorten further the short circuit detection time in order to realize a design emphasizing the ON voltage.

When an inverter is configured by using a FET using a WBG semiconductor, the FET is highly desirable to have a load short circuit withstand time of the same order as the conventional FET using Si. A mechanism leading to a breakdown during a load short circuit has been analyzed in detail with respect to thin IGBTs that are predominantly used as the switching element (see, for example, M. Otsuki and six more names, "Advanced Thin Wafer IGBTs with New Thermal Management Solution", Proceedings of ISPSD' 2003, p. 144-147). According to the analysis results, an excessively high generation loss during a load short circuit causes the element temperature to rise. As a result, a leak current of the PN junction rises, thermal burn-up is started, and breakdown occurs.

A band gap of Si is as narrow as about 1.1 eV. Therefore, at a temperature of equal to or higher than 200° C., Si moves locally into an intrinsic region, loses semiconductor properties, and becomes a conductor. Therefore, the element breakdown caused by such a rise in temperature to 200° C. or higher temperature frequently occurs. In order to avoid this breakdown, IGBTs and FETs using Si are designed so that a current at the time of load short circuit assumes an appropriate value, whereby the operation temperature of the semiconductor region is prevented from exceeding a critical point. Alternatively, the load short circuit breakdown is prevented by imparting a current limiting function with an external circuit (see, for example, M. Otsuki and three more names, "The 3rd Generation IGBT Toward a Limitation of IGBT Performance" Proceedings of $5^{th}$ ISPSD, 1993, p. 24-29).

Si IGBTs employed in inverters are devices using a bipolar effect. Therefore, the saturation current can be limited to a low value, while suppressing the ON voltage. Further, in a high breakdown voltage region of equal to or higher than 600 V, the ON resistance of MOSFET in Si is such that the resistance of MOSFET on the surface is much lower than the resistance of the silicon substrate. Therefore, even if the saturation current of the MOSFET itself is decreased, the effect produced on the ON resistance is small. Thus, a measure designed to lower the ON resistance is not necessarily realized together with a measure designed to increase the load circuit withstand time.

SUMMARY OF THE INVENTION

In a power MOSFET using SiC or GaN, the mobility of MOSFET is lower than that of silicon. Therefore, research has been conducted over and over again to overcome this drawback by a variety of means. For example, the MOSFET mobility has been increased by using a method for producing a gate oxide film, or a trench structure has been introduced into the MOSFET structure, or the MOSFET density per unit surface area has been increased by miniaturizing the MOSFET with the object of reducing the ON resistance. FIG. 6 is a cross-sectional view of the conventional vertical trench MOSFET. FIG. 7 is a cross-sectional view of the conventional vertical planar MOSFET. In FIG. 6, the reference numeral 13 stands for an n-type high-concentration semiconductor substrate, 14 stands for an n base layer, 15 stands for a p-well, 16 stands for a polysilicon gate electrode, 17 stands for a gate insulating film, 18 stands for an n-type source region, 19 stands for a source electrode, and 20 stands for an interlayer insulating film. In the planar MOSFET shown in FIG. 7, the p-well 21 is selectively formed, the n-type source region 18 is selectively formed on the surface of the p-well 21, and the gate electrode 22 is formed on the semiconductor substrate with the insulating film 20 being interposed therebetween. FIG. 9 is a characteristic diagram showing how an ON resistance depends on the unit cell size (plotted against the abscissa) in the cases in which a trench structure and a planar structure are used to increase the MOSFET mobility in a MOSFET with a breakdown voltage of 1200 V. As shown in FIG. 9, the ON resistance is decreased by using the trench structure, increasing the mobility, or miniaturizing and brought close to the substrate resistance serving as a limit.

However, with these means, whichever method is used, significant problems are associated with the load short circuit withstand time discussed hereinabove. Thus, the point is that with all the above-described means, the increase in MOSFET resistance causes the increase in a short circuit current value. This result is different from that obtained with Si and is due to the fact that in a case of WBG semiconductors such as SiC and GaN the resistance of the semiconductor substrate itself is much lower than that of Si and the ON resistance is almost entirely depends on the MOSFET portion of the semiconductor substrate surface. In FIG. 10, an ON resistance is plotted against the abscissa and a saturation current is plotted against the left ordinate. As the ON resistance is decreased and brought close to the limit resistance, the saturation current rapidly increases. The left ordinate in the figure shows the temperature rising within 1 µsec in a case of a 1200 V element when the power source voltage is 800 V. Thus, since the voltage is constant and equal to 800 V, such a relationship is realized because the generation loss is proportional to the saturation current and therefore the temperature rise is proportional to the current. Because the short circuit time is as short as 1 µsec, the effect of heat dissipation by thermal conduction is practically nonexistent and the temperature is determined only by the thermal capacity of the semiconductor. Therefore, as long as the object is to reduce the ON resistance so as to bring out the performance inherent to the WBG semiconductor, a load short circuit withstand capability is difficult to ensure. Where the object is to ensure the load short circuit withstand capability, the ON resistance is limited at the utmost to about 2 mΩcm$^2$, as shown in FIG. 10, and the merits of using the WBG semiconductor are lost.

In order to avoid such as situation, it is necessary to provide a current limiting function as described hereinabove. FIGS. 11 and 12 are examples of circuit diagrams of such MOSFETs provided with a current-limiting protection function. Thus, as shown in FIG. 11, a sensing resistor 5 is inserted to a source side of a sensitive transistor 4 that monitors the main current separately from a main transistor 3. Because the sensing resistor 5 is inserted, the source potential is raised by the flowing current. Where this voltage approaches the threshold of a shunt MOSFET 2, a current flows in the shunt MOSFET 2, the gate voltage of the main transistor 3 is lowered, and a current limiting operation is performed. The difference between this case and that shown in FIG. 12 is that a depression MOSFET 6 is used and no sensing resistor is used. In this case, the depression MOSFET 6 acts as a constant-current source, and where a predetermined current flows, the source potential of the sensing MOSFET 4 rapidly rises, the shunt MOSFET 2 is switched ON, and a current limiting operation similar to that described above is performed. The reference numerals 1 and 7 stand for gate resistors.

Introducing such a current limiting circuit is indispensable in a transistor using an inverter.

In a transistor using a WBG semiconductor that will be used in an inverter, part of a current limiting circuit is monolithically formed in the same chip with a main transistor, and in a case in which the main transistor is a trench MOS, the concentration distribution of a p-well has a profile with a peak inside rather than on the outermost surface, and a trench MOSFET that is the main transistor and a planar MOSFET that is part of the current limiting circuit have different thresholds. In a case of a planar MOSFET, the threshold of the lateral MOSFET that is part of the current limiting circuit is lower than the threshold of the main transistor.

The effect obtained with the semiconductor device in accordance with the present invention is that it is possible to provide a semiconductor device that is configured by using a WBG semiconductor and has high reliability and high load short circuit withstand capability, while maintaining a low ON resistance. Since a protection circuit is incorporated monolithically, characteristics of the MOSFET used in the protection circuit also change as the element temperature rises. Therefore, the current can be limited with higher accuracy.

BRIEF DESCRIPTION OF THE DRAWINGS

The invention will be described with reference to certain preferred embodiments thereof and the accompanying drawings, wherein.

DESCRIPTION OF THE PREFERRED EMBODIMENTS

Figure 1:
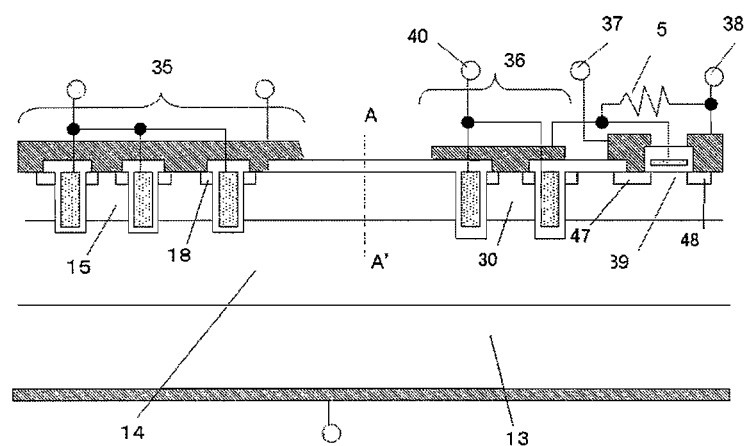
FIG. 1 is a cross-sectional view of a sensing trench MOSFET incorporating a shunt MOSFET of the first embodiment of the present invention.

The preferred embodiments of the semiconductor device in accordance with the present invention will be explained below in greater detail with reference to the appended drawings. FIG. 1 is a cross-sectional view illustrating a configuration example of the semiconductor device in accordance with the present invention. In the present embodiment, in a case where the main transistor is a trench MOSFET, a current-sensing MOS 36 that monitors the current is formed on the same semiconductor substrate with the main transistor 35 separately therefrom. In this case, a p-well 30 of the sensing MOS 36 is preferably separated from a source potential of the main transistor 35. In a case where no such separation is provided, an electrode has to be formed separately from the source of the sensing MOS 36 in order to set the p-well potential to the source potential, thereby increasing the surface area. Another drawback is that the distance to the p-well and electrode contact increases, a parasitic transistor easily operates and the probability of secondary breakdown increases. By so forming the current-sensitive MOS 36 monolithically on the same chip with the main transistor, it is possible to monitor the current under same temperature conditions and enable current limitation with good controllability. In addition, a lateral MOS 39 serving as a shunt MOS is incorporated. As a result, the number of externally provided components naturally can be reduced. The reference numeral 40 stands for a gate terminal of the current-sensing MOS 36; 37 stands for a drain terminal of the shunt MOS 39; 47 stands for an n-type drain region of the shunt MOS 39; 38 stands for a source terminal of the shunt MOS 39; 48 stands for a source region of the shunt MOS 39; and 5 stands for a sensing resistor. The gate of the shunt MOS 39 is connected to the connection point of the sensing resistor 5 and the source electrode of the sensing MOS 36. Because the shunt MOS 39 used in a current limiting circuit is a current limiting circuit of the main transistor 35, the gate voltage of the shunt MOS cannot be made higher than the gate voltage of the main transistor 35. Therefore, it is preferred that the gate voltage of the shunt MOS could be designed separately from the threshold of the main transistor 35.

Figure 2:
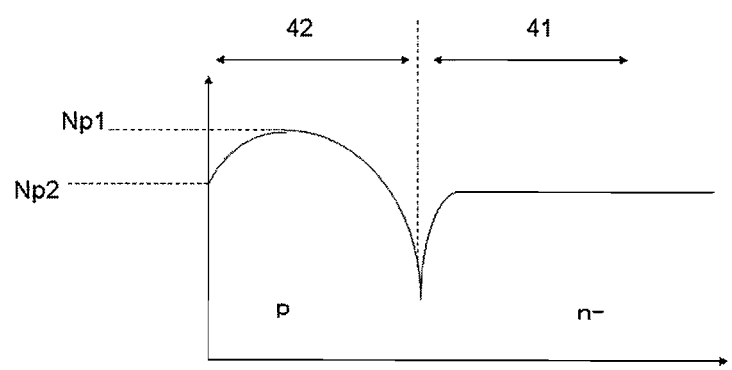
FIG. 2 is a profile diagram illustrating a concentration distribution of a p-well in the first embodiment.

A dopant distribution in the A-A' line section of the p-well of the trench MOSFET used in the configuration shown in FIG. 1 is shown in FIG. 2. A threshold of a vertical trench MOS is determined by the maximum concentration of the p-well. By contrast, the threshold of a transverse MOSFET is determined by the surface concentration of the p-well. As shown in FIG. 2, the p-well concentration is formed such that the maximum concentration Np1 is positioned at a certain depth below the surface concentration Np2 (it is also possible to lower the surface concentration Np2). Thus, the surface concentration that determines the threshold of the transverse MOSFET and the maximum concentration that determines the threshold of the trench MOSFET can be set to separate concentrations, and a threshold of each MOSFET can thus be set by changing the peak depth of the maximum concentration of the p-well. This dopant concentration can be easily realized by epitaxial growth or a high-energy ion injection method when the p-well is formed. A resistor that is another elemental component can be easily formed in the semiconductor.

Figure 3:
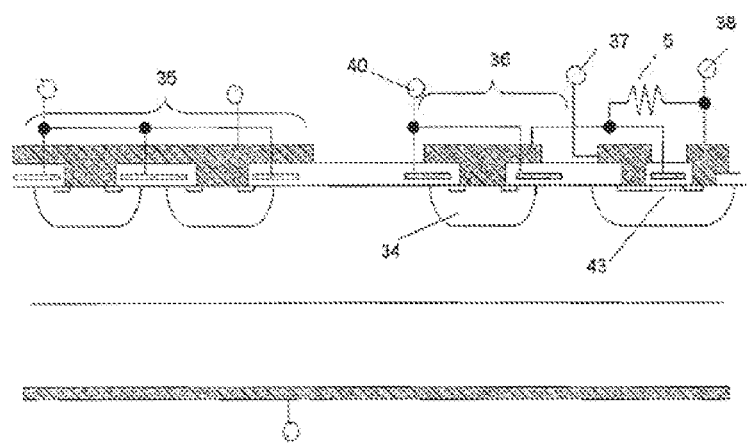
FIG. 3 is a cross-sectional view of a sensing planar MOSFET incorporating a shunt MOSFET of the second embodiment of the present invention.

FIG. 3 is a cross-sectional view illustrating the second embodiment of the semiconductor device in accordance with the present invention. In this embodiment, when the main transistor is a planar power MOSFET, a sensing MOS 36 is formed on the same semiconductor separately from a main transistor 35. Similarly to the above-described first embodiment, it is preferred that a p-well 34 of the sensing MOS 36 be separated from the source of the main transistor 35. A specific feature of the planar structure is that field concentration to the gate oxide film is relaxed. In particular in a case of a WBG semiconductor, because the maximum field intensity of the semiconductor is high, the electric field intensity toward the oxide film tends to increase. Therefore, with the WBG semiconductor, a planar power MOSFET structure is especially important. Further, a lateral MOS serving as a shunt MOS is incorporated. In this case, the threshold adjustment can be made by conducting local ion implantation in a channel portion 43 by using a mask in order to set the threshold of the lateral MOSFET to a value different from that of the power MOSFET, as described hereinabove.

Figure 4:
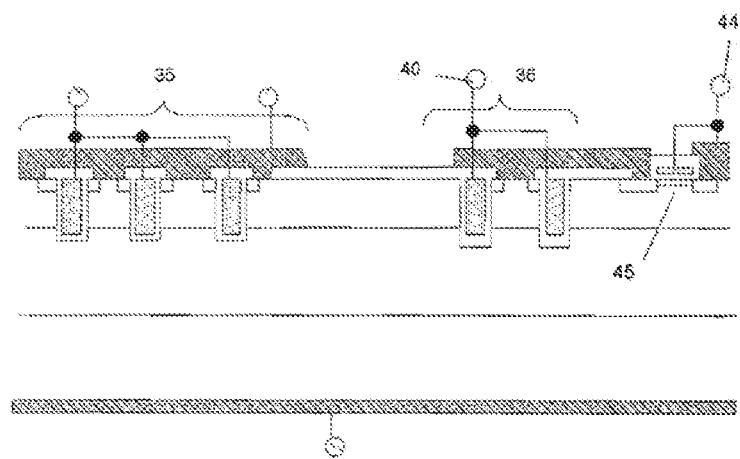
FIG. 4 is a cross-sectional view of a trench MOSFET provided with a protection function that incorporates a depression MOS of the third embodiment of the present invention.
Figure 12:
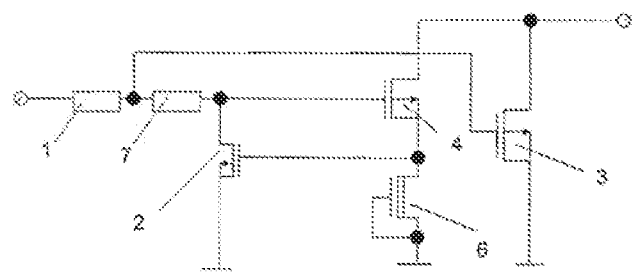
FIG. 12 is a circuit diagram of the conventional vertical MOSFET having a protection function.

FIG. 4 is a cross-sectional view illustrating the third embodiment of the semiconductor device in accordance with the present invention. In this example, a depression MOSFET is used as part of a protective circuit and it is possible to form a circuit configuration such as shown in FIG. 12 that illustrates the conventional protective circuit. In this case, in the concentration distribution of the p-well, a method can be used by which the surface concentration is lowered as shown in FIG. 2 and set to ensure inversion to an N type, but in this case it is sometimes difficult to enable the contact with the p-well on the surface of the main transistor 35 or sensing transistor 36. Therefore, the contact portion is dug down and a trench contact is formed to enable the contact with the p-well. Another option is to conduct ion implantation for threshold control only in a channel region 45 of the depression MOSFET portion.

Figure 5:
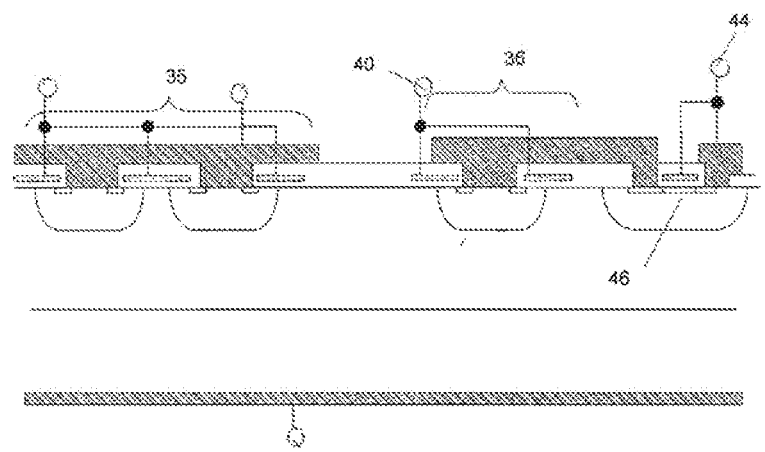
FIG. 5 is a cross-sectional view of a planar MOSFET provided with a protection function that incorporates a depression MOS of the fourth embodiment of the present invention.
Figure 6:
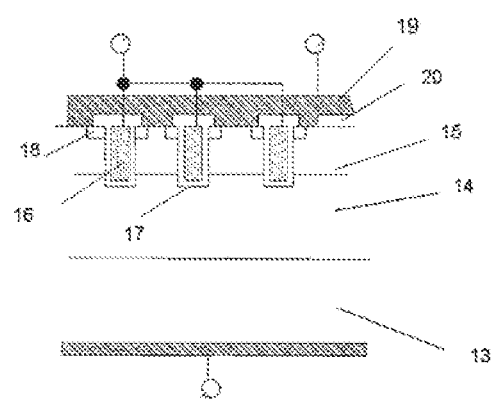
FIG. 6 is a cross-sectional view of the conventional trench MOSFET with a high withstand voltage.
Figure 7:
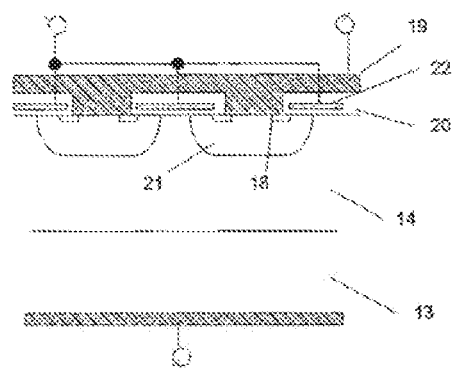
FIG. 7 is a cross-sectional view of the conventional planar MOSFET with a high withstand voltage.
Figure 8:
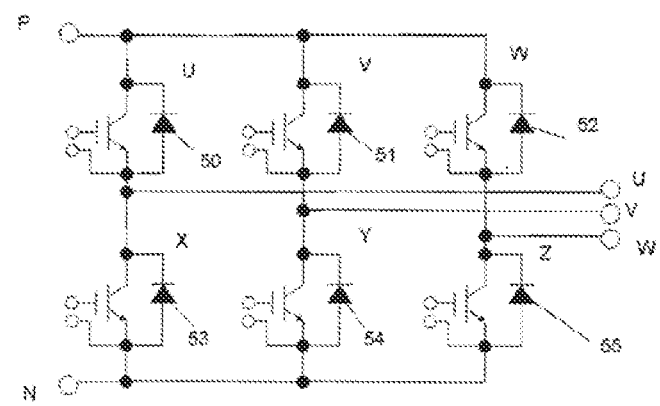
FIG. 8 is a circuit diagram of an inverter.
Figure 9:
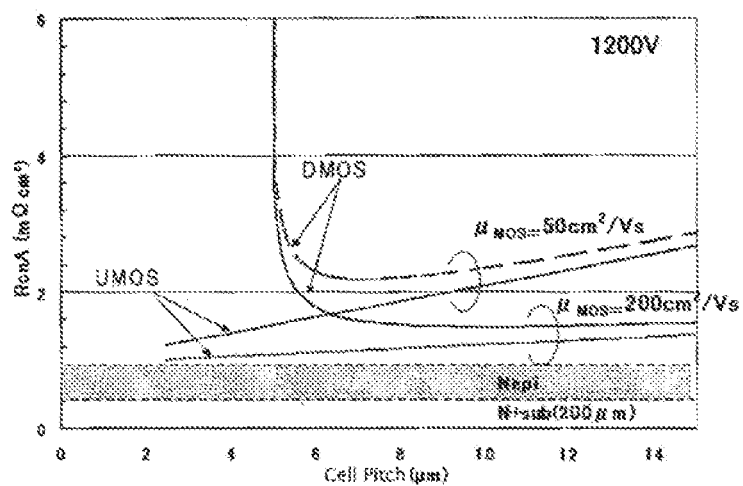
FIG. 9 is a characteristic diagram illustrating the reduction of ON resistance by various improvement techniques.
Figure 10:
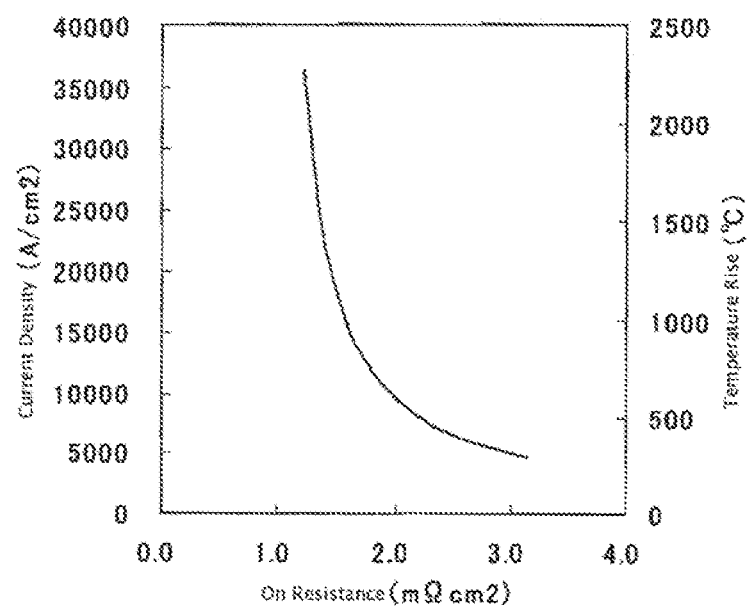
FIG. 10 is a characteristic diagram illustrating an ON voltage, a saturation current value, and a temperature increase during a short circuit.
Figure 11:
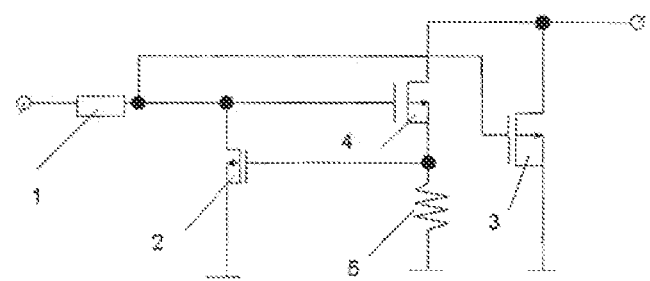
FIG. 11 is a circuit diagram of the conventional vertical MOSFET having a protection function.

FIG. 5 is a cross-sectional view illustrating the fourth embodiment of the semiconductor device in accordance with the present invention. In this example, the main transistor is a planar MOSFET, a depression MOSFET is used in part of the protective circuit, and a circuit configuration such as in FIG. 12 that shows a conventional circuit can be formed. In this case, ion implantation for threshold control is conducted only in a channel region 46 of the depression MOSFET portion.

By employing the above-described device configuration, it is possible to realize both a means for reducing the ON voltage and a measure that ensures short circuit withstand capability and enable practical applications of WBG semiconductors to motor drive and inverters.

As described hereinabove, the semiconductor device in accordance with the present invention is useful for power switching transistors in particular for power switching elements such as inverter circuits.

The invention has been described with reference to certain preferred embodiments thereof. It will be understood, however, that variations and modifications are possible within the scope of the appended claims.

What is claimed is:
1. A wide band gap semiconductor device for application to a switching element of an inverter circuit, the device comprising:
   a main transistor;
   a sensing transistor connected in parallel to the main transistor that detects a microcurrent proportional to a current flowing in the main transistor; and
   a lateral MOSFET that controls a gate of the main transistor on the basis of an output of the sensing transistor;
   wherein the main transistor, the sensing transistor and the lateral MOSFET are all formed on the same semiconductor substrate;
   wherein a band gap of the semiconductor substrate is wider than that of silicon; and
   wherein the main transistor and the sensing transistor each include a gate structure formed in a trench groove, and a surface dopant concentration of a p-well is set to be lower than a dopant concentration at a predetermined depth of the p-well below the surface of the p-well, and
   wherein the dopant concentration of the p-well continuously increases in accordance with the depth of the p-well, from the surface of the p-well, to the predetermined depth.

* * * * *

UNITED STATES PATENT AND TRADEMARK OFFICE
CERTIFICATE OF CORRECTION

| | |
|---|---|
| PATENT NO. | : 9,450,084 B2 |
| APPLICATION NO. | : 12/718514 |
| DATED | : September 20, 2016 |
| INVENTOR(S) | : Katsunori Ueno |

It is certified that error appears in the above-identified patent and that said Letters Patent is hereby corrected as shown below:

On the Title Page

(73) ASSIGNEE: the Assignee is incorrect and should appear as follows:
--FUJI ELECTRIC CO., LTD., Kawasaki-shi (JP)--

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*